(12) United States Patent
Gailus (10) Patent No.: US 9,300,074 B2
(45) Date of Patent: Mar. 29, 2016

(54) HIGH SPEED, HIGH DENSITY ELECTRICAL CONNECTOR

(71) Applicant: Amphenol Corporation, Wallingford, CT (US)

(72) Inventor: Mark W. Gailus, Concord, MA (US)

(73) Assignee: Amphenol Corporation, Wallingford, CT (US)

( * ) Notice: Subject to any disclaimer, the term of this patent is extended or adjusted under 35 U.S.C. 154(b) by 0 days.

(21) Appl. No.: 13/752,534

(22) Filed: Jan. 29, 2013

(65) Prior Publication Data

US 2013/0196553 A1    Aug. 1, 2013

Related U.S. Application Data

(63) Continuation of application No. 12/829,849, filed on Jul. 2, 2010, now Pat. No. 8,371,875, which is a continuation of application No. 12/104,925, filed on Apr. 17, 2008, now Pat. No. 7,771,233, which is a continuation of application No. 10/955,571, filed on Sep. 30, 2004, now Pat. No. 7,371,117.

(51) Int. Cl.

| H01R 13/648 | (2006.01) |
|---|---|
| H01R 13/46 | (2006.01) |
| H01R 13/6586 | (2011.01) |
| H01R 13/719 | (2011.01) |
| H01R 12/50 | (2011.01) |
| H01R 43/16 | (2006.01) |

(Continued)

(52) U.S. Cl.
CPC ............ *H01R 13/46* (2013.01); *H01R 13/6586* (2013.01); *H01R 13/719* (2013.01); *H01R 23/688* (2013.01); *H01R 43/16* (2013.01); *H01R 13/514* (2013.01); *H05K 1/0233* (2013.01); *Y10T 29/49204* (2015.01)

(58) Field of Classification Search
CPC . H01R 13/6586; H01R 13/514; H01R 23/688
USPC ................ 174/255–258; 439/607.05, 607.02, 439/607.03, 607.08–607.1, 86–91, 101, 108
See application file for complete search history.

(56) References Cited

U.S. PATENT DOCUMENTS

| 3,322,885 A | 5/1967 | May et al. |
|---|---|---|
| 4,519,664 A | 5/1985 | Tillotson |
| 4,519,665 A | 5/1985 | Althouse et al. |

(Continued)

FOREIGN PATENT DOCUMENTS

| CN | 1398446 A | 2/2003 |
|---|---|---|
| JP | 2002117938 A | 4/2002 |

(Continued)

*Primary Examiner* — Felix O Figueroa
(74) *Attorney, Agent, or Firm* — Blank Rome LLP (57) ABSTRACT

An electrical connector with electrically lossy materials bridging ground members. The lossy conductive members may be formed by filling a settable binder with conductive particles, allowing the partially conductive members to be formed through an insert molding process. Connectors assembled from wafers that contain signal conductors held within an insulative housing may incorporate lossy conductive members by having filled thermal plastic molded onto the insulative housing. The lossy conductive members may be used in conjunction with magnetically lossy materials. The lossy conductive members reduce ground system do resonance within the connector, thereby increasing the high frequency performance of the connector.

25 Claims, 11 Drawing Sheets

(51) Int. Cl.
    *H01R 13/514*  (2006.01)
    *H05K 1/02*  (2006.01)

(56) References Cited

U.S. PATENT DOCUMENTS

| | | |
|---|---|---|
| 5,246,388 A | 9/1993 | Collins et al. |
| 5,346,410 A | 9/1994 | Moore, Jr. |
| 5,982,253 A * | 11/1999 | Perrin et al. ............. 439/620.09 |
| 6,293,827 B1 | 9/2001 | Stokoe |
| 6,299,483 B1 | 10/2001 | Cohen et al. |
| 6,409,543 B1 | 6/2002 | Astbury, Jr. et al. |
| 6,506,076 B2 | 1/2003 | Cohen et al. |
| 6,609,933 B2 * | 8/2003 | Yamasaki ................ 439/607.11 |
| 6,616,864 B1 | 9/2003 | Jiang et al. |
| 6,709,294 B1 | 3/2004 | Cohen et al. |
| 6,713,672 B1 | 3/2004 | Stickney |
| 6,776,659 B1 | 8/2004 | Stokoe et al. |
| 6,786,771 B2 | 9/2004 | Gailus |
| 7,371,117 B2 | 5/2008 | Gailus |
| 7,753,731 B2 | 7/2010 | Cohen et al. |
| 7,771,233 B2 | 8/2010 | Gailus |
| 2001/0046810 A1 | 11/2001 | Cohen et al. |
| 2004/0121652 A1 | 6/2004 | Gailus |
| 2008/0248660 A1 | 10/2008 | Kirk et al. |

FOREIGN PATENT DOCUMENTS

| | | |
|---|---|---|
| JP | 200317193 A | 1/2003 |
| WO | 03047049 A1 | 6/2003 |

\* cited by examiner

HIGH SPEED, HIGH DENSITY ELECTRICAL CONNECTOR

CROSS REFERENCE TO RELATED APPLICATIONS

This patent application is a continuation of U.S. Pat. No. 8,371,875, filed Jul. 2, 2010, which is a continuation of U.S. Pat. No. 7,771,233, filed Apr. 17, 2008, which is a continuation of U.S. Pat. No. 7,371,117, filed Sep. 30, 2004, the entire disclosure of each of these is hereby incorporated by reference herein.

BACKGROUND OF INVENTION

1. Field of Invention

This invention relates generally to an electrical interconnection systems and more specifically to improved signal integrity in interconnection systems.

2. Discussion of Related Art

Electrical connectors are used in many electronic systems. It is generally easier and more cost effective to manufacture a system on several printed circuit boards ("PCBs") which are then connected to one another by electrical connectors. A traditional arrangement for connecting several PCBs is to have one PCB serve as a backplane. Other PCBs, which are called daughter boards or daughter cards, are then connected through the backplane by electrical connectors.

Electronic systems have generally become smaller, faster and functionally more complex. These changes mean that the number of circuits in a given area of an electronic system, along with the frequencies at which the circuits operate, have increased significantly in recent years. Current systems pass more data between printed circuit boards and require electrical connectors that are electrically capable of handling the increased bandwidth.

As signal frequencies increase, there is a greater possibility of electrical noise being generated in the connector in forms such as reflections, cross-talk and electromagnetic radiation. Therefore, the electrical connectors are designed to control cross-talk between different signal paths and to control the characteristic impedance of each signal path. Shield members are often used for this purpose. Shields are placed adjacent the signal contact elements.

Cross-talk between distinct signal paths can be controlled by arranging the various signal paths so that they are spaced further from each other and nearer to a shield, which is generally a grounded plate. Thus, the different signal paths tend to electromagnetically couple more to the shield and less with each other. For a given level of cross-talk, the signal paths can be placed closer together when sufficient electromagnetic coupling to the ground conductors are maintained.

Shields are generally made from metal components. However, U.S. Pat. No. 6,709,294 (the "294 patent"), which is assigned to the same assignee as the present application, describes making shields in a connector from conductive plastic. The '294 patent is hereby incorporated by reference in its entirety.

Electrical connectors can be designed for single-ended signals as well as for differential signals. A single-ended signal is carried on a single signal conducting path, with the voltage relative to a common reference conductor being the signal.

Differential signals are signals represented by a pair of conducting paths, called a "differential pair." The voltage-difference between the conductive paths represents the signal. In general, the two conducing paths of a differential pair are arranged to run near each other. No shielding is desired between the conducting paths of the pair but shielding may be used between differential pairs.

One example of a differential pair electrical connector is shown in U.S. Pat. No. 6,293,827 ("the '827 patent"), which is assigned to the assignee of the present application. The '827 patent is incorporated by reference herein. The '827 patent discloses a differential signal electrical connector that provides shielding with separate shields corresponding to each pair of differential signals. U.S. Pat. No. 6,776,659 (the '659 patent), which is assigned to the assignee of the present application, shows individual shields corresponding to individual signal conductors. Ideally, each signal path is shielded from all other signal paths in the connector. Both the '827 patent and the '659 patents are hereby incorporated by reference in their entireties.

While the electrical connectors disclosed in the '827 patent and the '659 patent and other presently available electrical connector designs provide generally satisfactory performance, the inventors of the present invention have noted that at high speeds (for example, signal frequencies of 1 GHz or greater, particularly above 3 GHz), electrical resonances in the shielding system can create cross talk and otherwise degrade performance of the connector. We have observed that such resonances are particularly pronounced in ground systems having a shield member per signal contact or per differential pair.

My prior patent, U.S. Pat. No. 6,786,771, now published as US 2004/0121652A1, which is hereby incorporated by reference in its entirety, describes the use of lossy material to reduce unwanted resonances and improve connector performance. It would be desirable to further improve connector performance.

SUMMARY OF INVENTION

In one aspect, the invention relates to a wafer for an electrical connector having a plurality of wafers. The wafer has a plurality of first type contact elements, positioned in a column; a plurality of discrete conductive elements each disposed adjacent at least one of the first type contact elements; insulative material securing at least the plurality of first type contact elements; and electrically lossy material bridging the discrete conductive elements.

In another aspect, the invention relates to an electrical connector that has a plurality of regions. Each region has insulative material; a plurality of signal conductors, each signal conductor having a contact tail and a contact portion and an intermediate portion there between, and at least a part of the intermediate portion of each of the signal conductors secured in the insulative material; a plurality of shield members, each shield member having an intermediate portion adjacent an intermediate portion of a signal conductor; and electrically lossy material positioned adjacent the intermediate portion of the each of the shield members.

In yet another aspect, the invention relates to an electronic system with a plurality of printed circuit boards, each printed circuit board having a plurality of ground structures and a plurality of signal traces. Electrical connectors are mounted to the plurality of printed circuit boards. Each connector has a first plurality of conducting members, each connected to a ground structure in at least one of the plurality of printed circuit boards; a second plurality of conducting members, each connected to at least one of the plurality of signal traces in at least one of the plurality of printed circuit boards, the second plurality of conducting members being positioned in groups with at least two conducting members of the first plurality of conducting members positioned adjacent conducting members of the second plurality of conducting members in each group; and a plurality of partially conductive members, each connecting the at least two conducting members of the first plurality of conducting members positioned adjacent conducting members of the second plurality of conducting members in a group.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIG. 5b is a perspective view of the shield strips of FIG. 5a;

FIG. 9a is a cross section to the wafer illustrated in FIG. 8a taken along the line 9a-9a;

FIG. 9b is a cross section of an alternative embodiment of the wafer shown in FIG. 9a;

FIG. 9c is a cross section of an alternative embodiment of the wafer shown in FIG. 9a.

DETAILED DESCRIPTION

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

Figure 1:
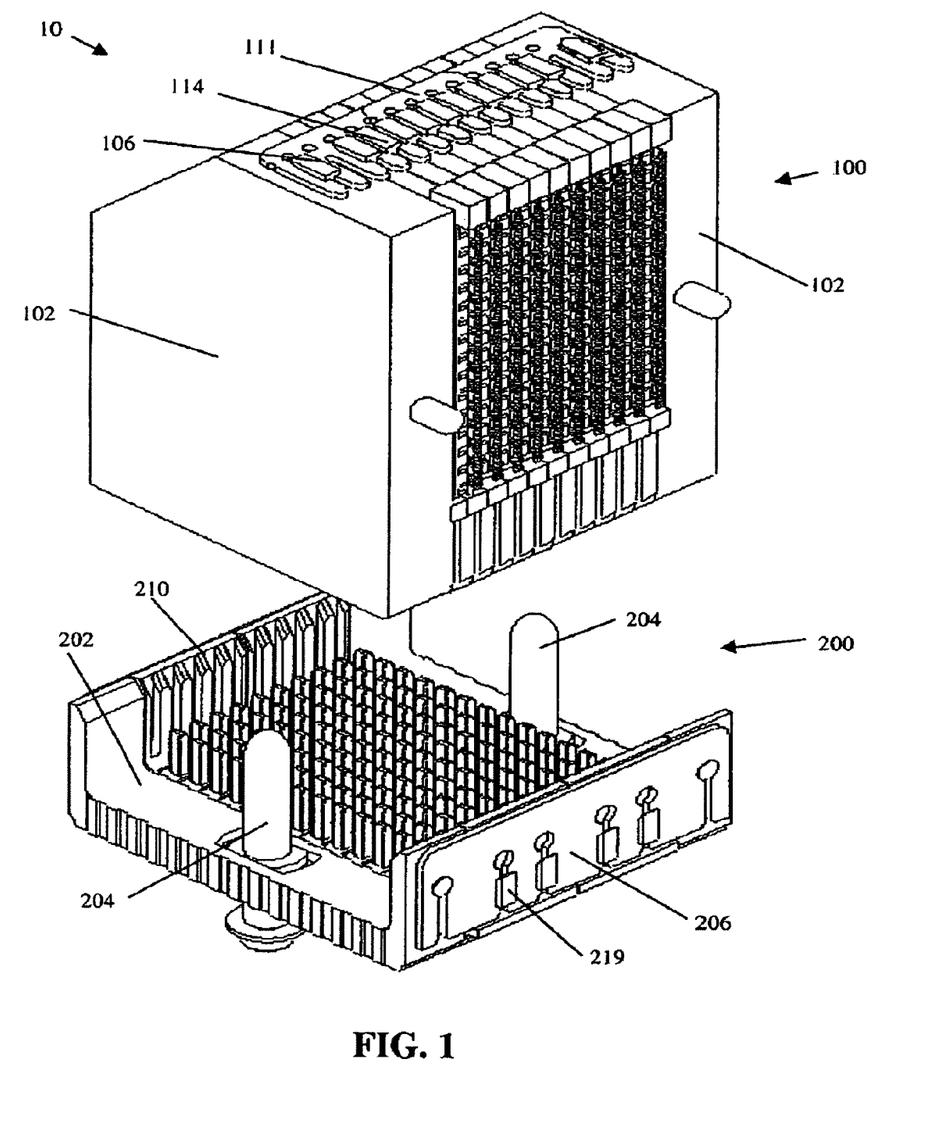
FIG. 1 is a perspective view of an electrical connector assembly showing a first electrical connector about to mate with a second electrical connector.
Figure 2:
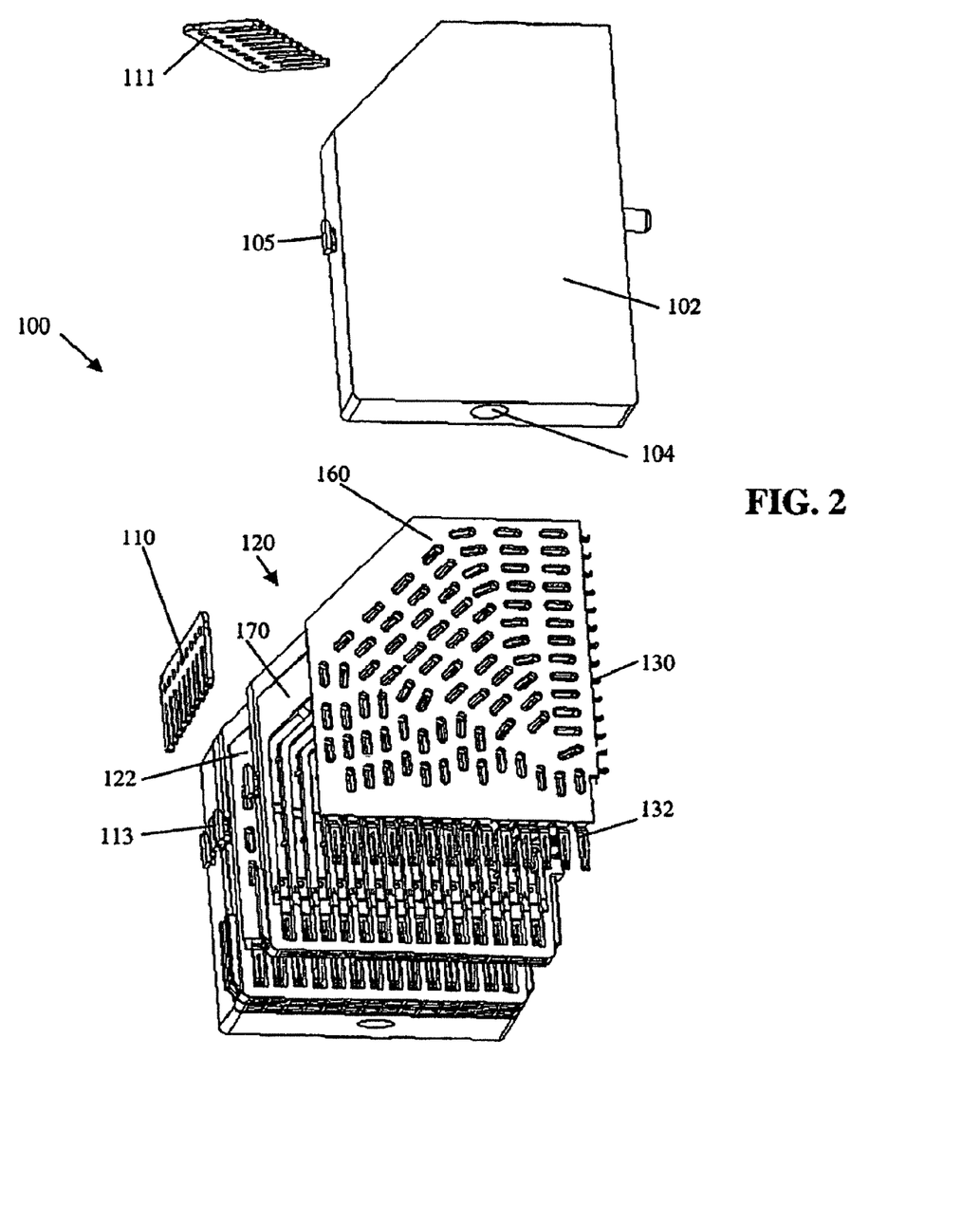
FIG. 2 is an exploded view of the first electrical connector of FIG. 1, showing a plurality of wafers.

Referring to FIG. 1, there is shown an electrical connector assembly 10. The electrical connector assembly 10 includes a first electrical connector 100 mateable to a second electrical connector 200. Electrical connector 100 may be used as a daughter card connector and electrical connector 200 may be used as a backplane connector. However the invention may be broadly applied in many types of connectors.

The second electrical connector 200 may be as described in the above referenced U.S. Pat. No. 6,776,659.

The first electrical connector 100, which is shown in greater detail in FIGS. 2-13, includes a plurality of wafers 120, with each of the plurality of wafers 120 having a housing 122, a plurality of signal conductors 124 (see FIG. 3) and a plurality of shield strips 126 (see FIGS. 5a and 5b)). For exemplary purposes only, the first electrical connector 100 is illustrated with ten wafers 120, with each wafer 120 having fourteen single-ended signal conductors 124 and corresponding fourteen shield strips 126. However, as it will become apparent later, the number of wafers and the number of signal conductors and shield strips in each wafer may be varied as desired.

The first electrical connector 100 is also shown having alignment modules 102 on either end, with each alignment module 102 having an opening 104 (FIG. 2) for receiving a guide pin (which may also be referred to as a corresponding rod) 204 from member 202 of the second electrical connector 200. Each alignment module 102 further includes features 105 (FIG. 2), 106 to engage slots in stiffeners 110, 111, respectively. Likewise, the insulative housing 122 of each wafer 120 provides features 113, 114 to engage the slots in stiffeners 110 (FIG. 2), 111, respectively.

Each signal conductor 124 has contact end 130 connectable to a printed circuit board, a contact end 132 connectable to the second electrical connector 200, and an intermediate portion 131 there between. Each shield strip 126 (FIG. 5a) has a first contact end 140 connectable to the printed circuit board, a second contact end 142 connectable to the second electrical connector 200, and an intermediate portion 141 there between.

In the embodiment of the invention illustrated in FIGS. 1-8b, the first contact end 130 of the signal conductors 124 includes a contact tail 133 having a contact pad 133a that is adapted for soldering to the printed circuit board. The second contact end 132 of the signal conductors 124 includes a dual beam structure 134 configured to mate to a corresponding mating structure of the second electrical connector 200. The first contact end 140 of the shield strips 126 includes at least two contact tails 143, 144 having contact pads 143a, 144a, respectively, that are adapted for soldering to the printed circuit board. The second contact end 142 of the shield strips 126 includes opposing contacting members 145, 146 that are configured to provide a predetermined amount of flexibility when mating to a corresponding structure of the second electrical connector 200. While the drawings show contact tails adapted for soldering, it should be apparent to one of ordinary skill in the art that the first contact end 130 of the signal conductors 124 and the first contact end 140 of the shield strips 126 may take any known form (e.g., press-fit contacts, pressure-mount contacts, paste-in-hole solder attachment) for connecting to a printed circuit board.

Figure 5A:
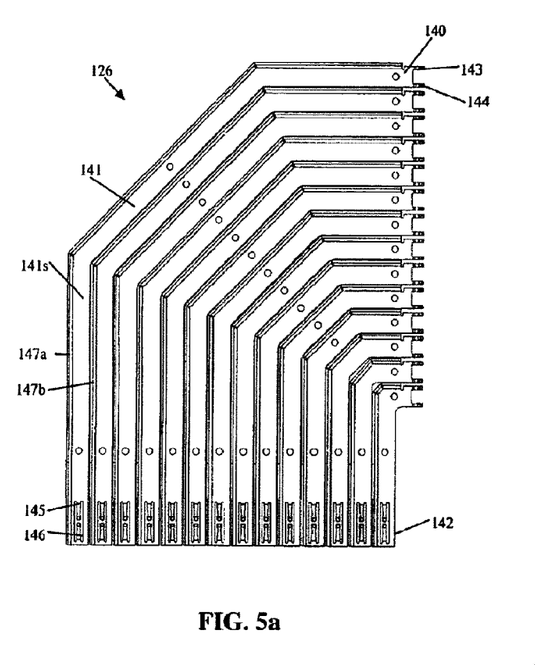
FIG. 5a is a side view of shield strips of one of the wafers of the first electrical connector of FIG. 2.
Figure 5B:
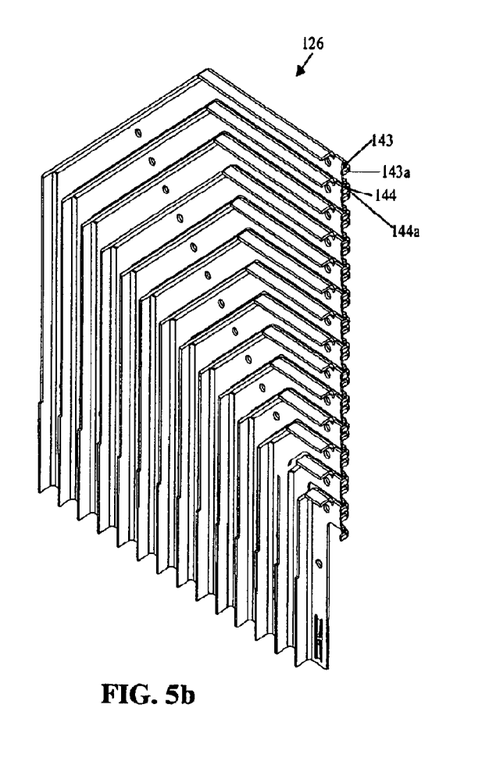

Still referring to FIGS. 5a and 5b, the intermediate portion 141 of each shield strip 126 has a surface 141s with a first edge 147a and a second edge 147b, at least one of the first edge 147a or the second edge 147b being bent out of the plane of surface 141s. In the illustrated embodiment, the first edge 147a is bent substantially perpendicular to the surface 141s of the shield strip 126 and extends through to the end of the second contact end 142 (but not through to the end of the first contact end 140).

Figure 3:
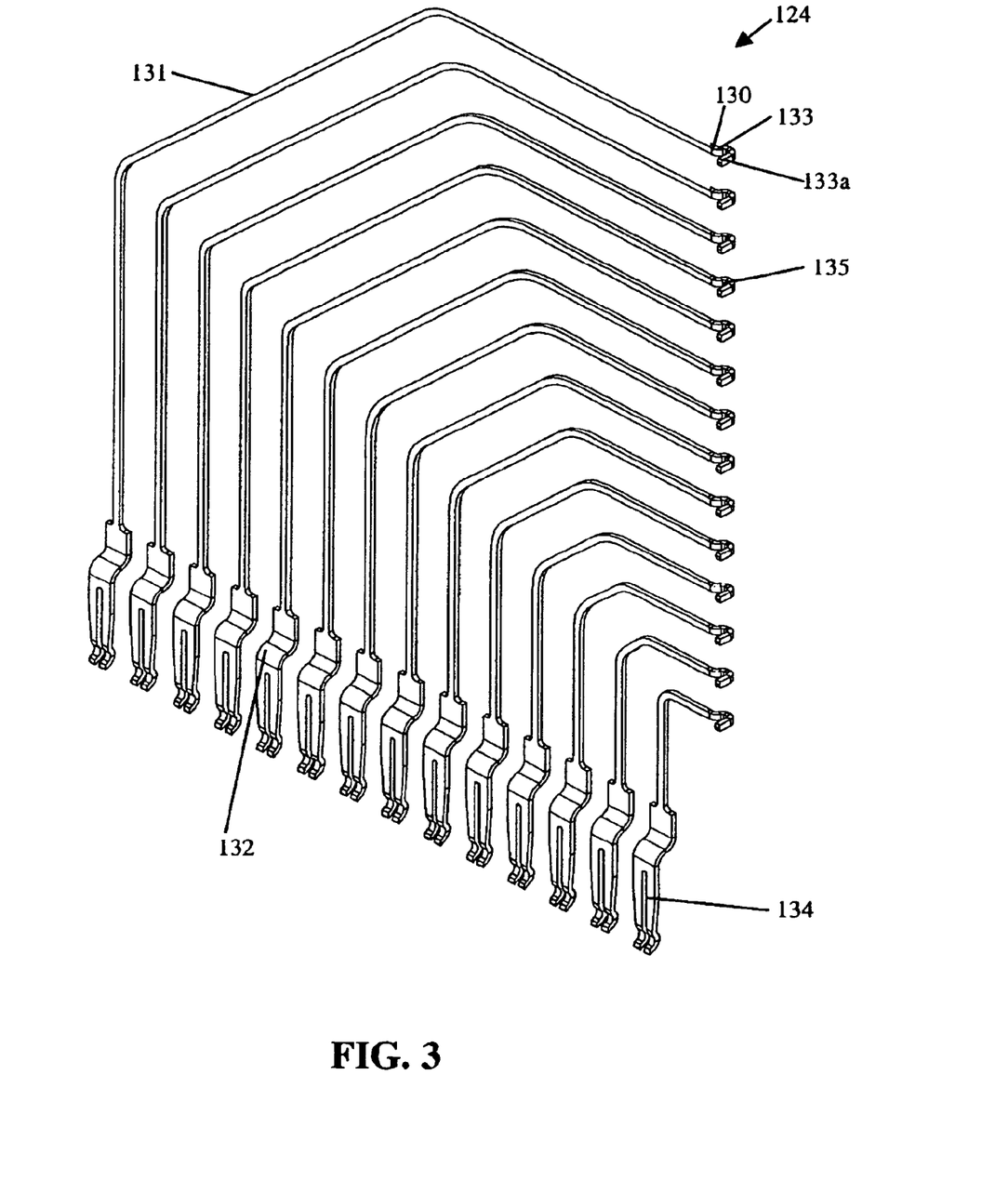
FIG. 3 is a perspective view of signal conductors of one of the wafers of the first electrical connector of FIG. 2.
Figure 4:
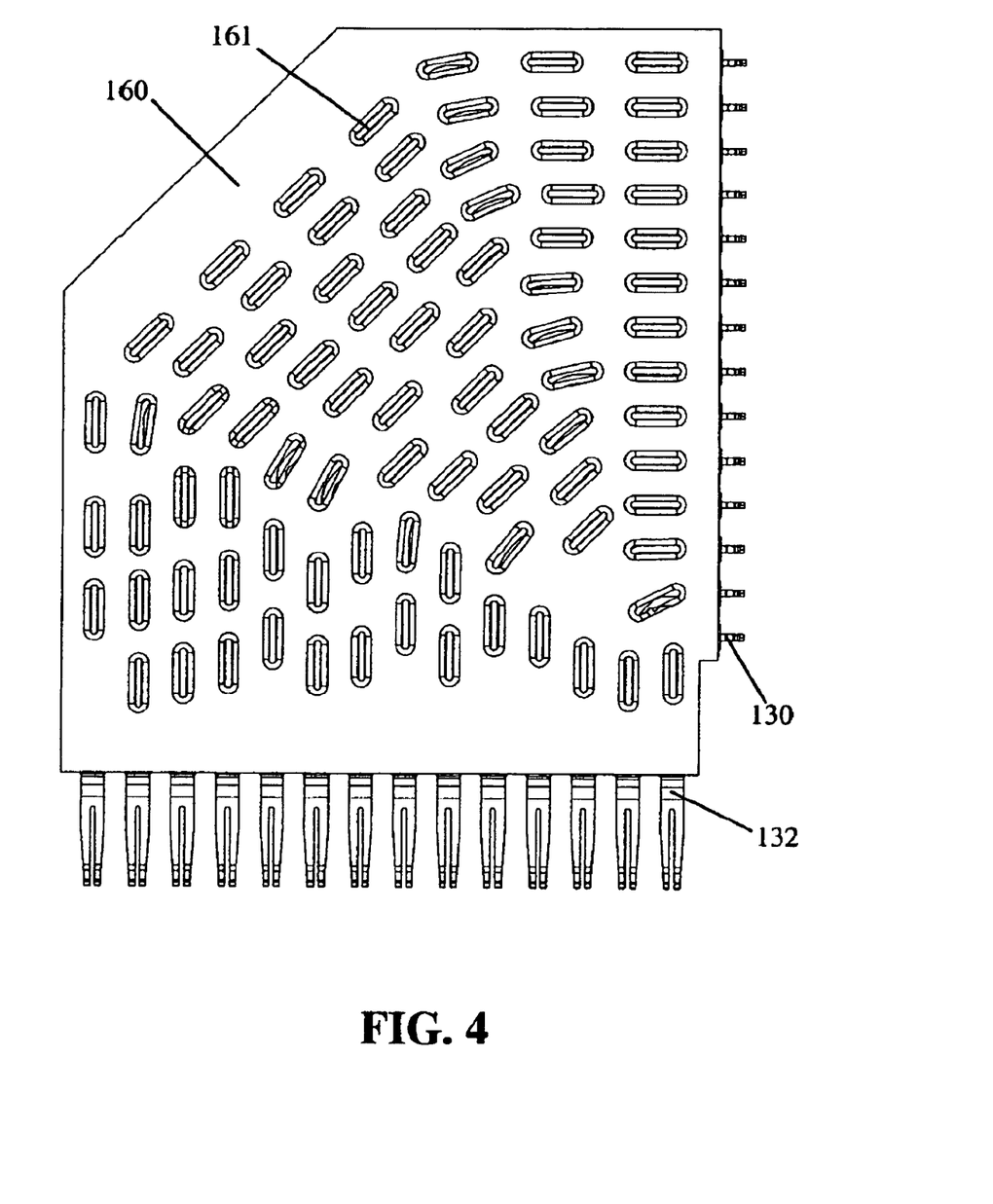
FIG. 4 is a side view of the signal conductors of FIG. 3 with an insulative housing formed around the signal conductors.

FIG. 4 is a side view of the signal conductors 124 of FIG. 3, with the signal conductors 124 disposed in a first insulative housing portion 160. Preferably, the first insulative housing portion 160 is formed around the signal conductors 124 by injection molding plastic. To facilitate this process, the signal conductors 124 are preferably held together on a lead frame (not shown) as known in the art. Although not required, the first insulative housing portion 160 may be provided with windows 161 adjacent the signal conductors 124. These windows 161 are intended to generally serve multiple purposes, including to: (i) ensure during an injection molding process that the signal conductors 124 are property positioned, (ii) provide impedance control to achieve desired impedance characteristics, and (iii) facilitate insertion of materials which have electrical properties different than housing 160.

Figure 7:
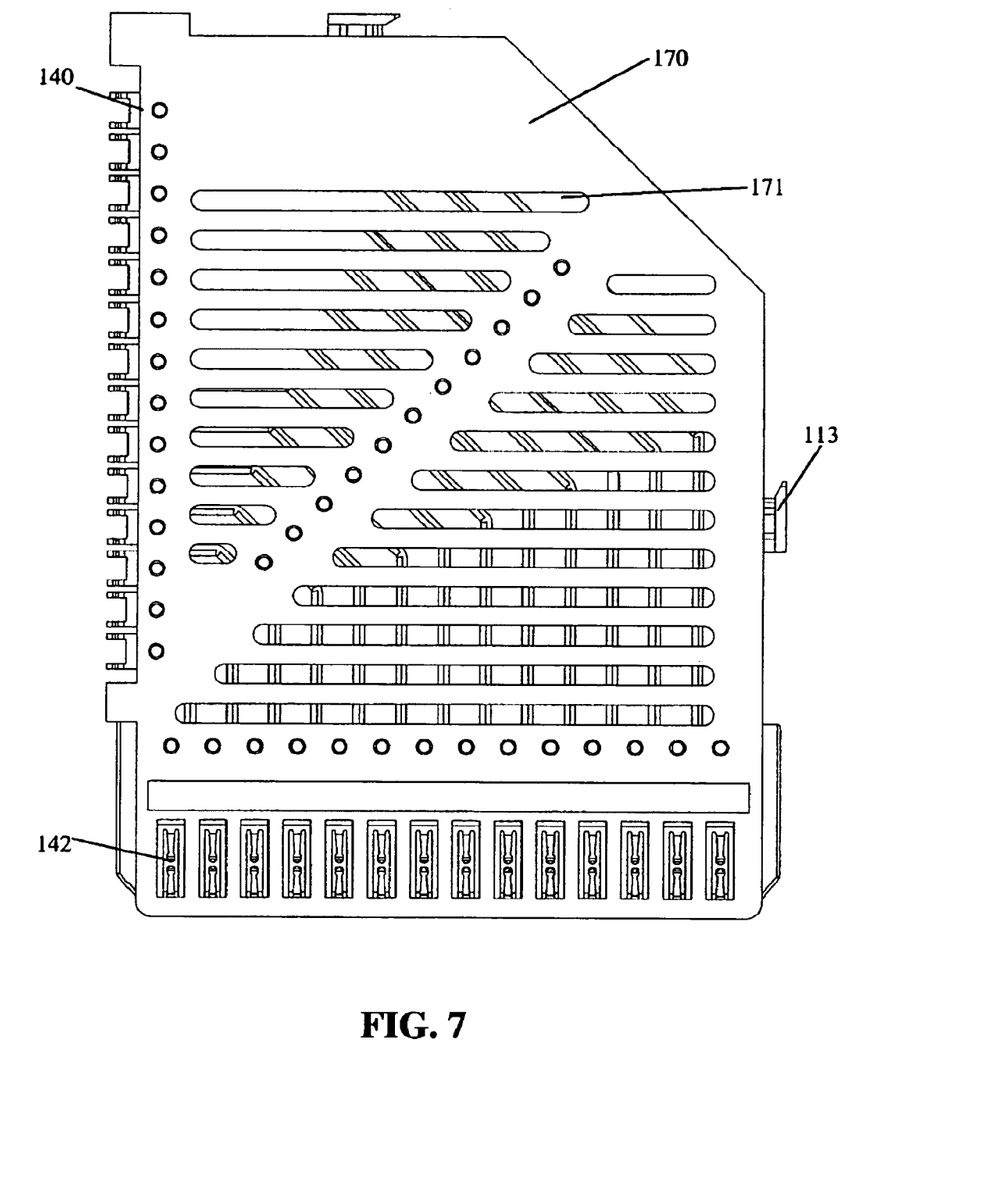
FIG. 7 is a side view of the shield strips of FIG. 5a with an insulative housing formed around the shield strips.

FIG. 7 is a side view of the shield strips 126 of FIGS. 5a and 5b, with the shield strips 126 disposed in a second housing portion 170. As will be described in greater detail below, housing portion 170 may be formed from one or more materials that provides insulation, conductivity, lossy conductivity or magnetic lossiness.

Figure 6:
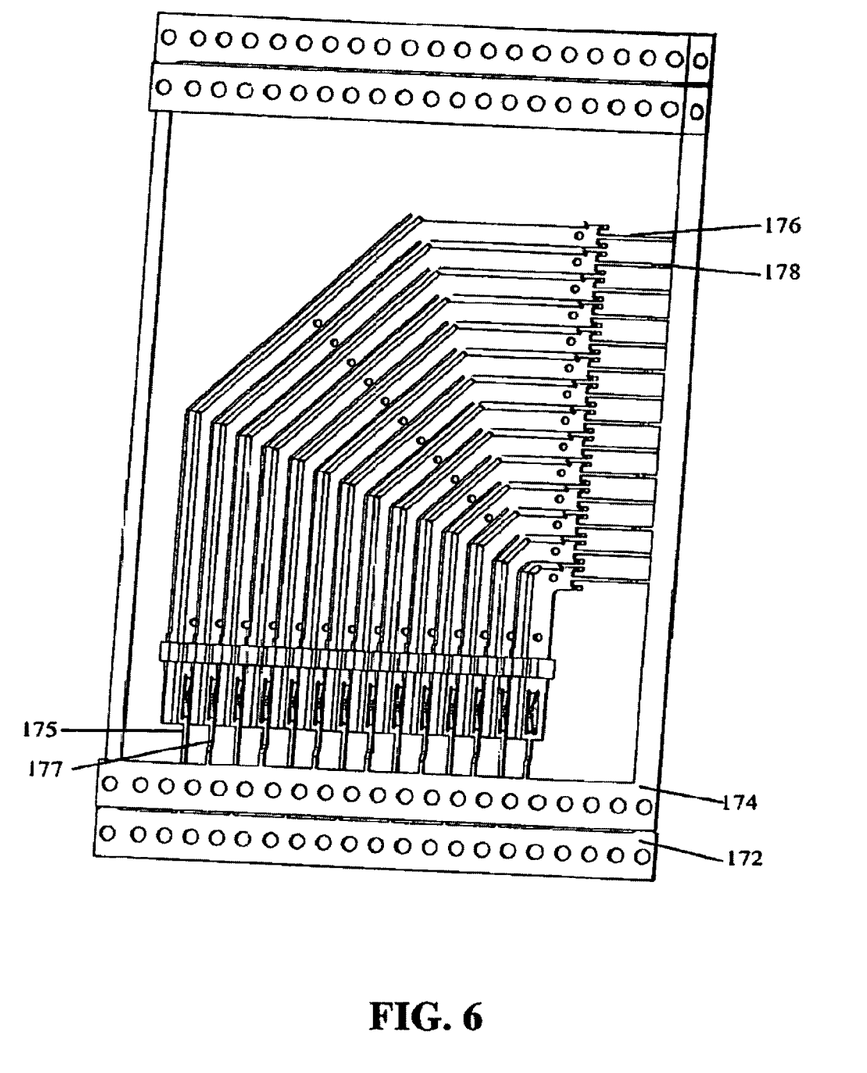
FIG. 6 is a side view of the shield strips of FIG. 5a formed on two lead frames, with each lead frame holding half of the shield strips.

Housing portion 170 may be formed in whole or in part by injection molding of material around shield strips 126. To facilitate the injection molding process, the shield strips 126 are preferably held together on two lead frames 172, 174, as shown in FIG. 6. Each lead frame 172, 174 holds every other of the plurality of the shield strips 126, so when the lead frames 172, 174 are placed together, the shield strips 126 will be aligned as shown in FIGS. 5a and 5b. In the embodiment shown, each lead frame 172, 174 holds a total of seven shield strips 126.

The lead frame 172 includes the bars 175 that connect to the second contact ends 142 of its respective shield strips 126 and tie bars 176 that connect to the first contact ends 140 of the shield strips 126. The lead frame 174 includes tie bars 177 that connect to the second contact ends 142 of its respective shield strips 126 and tie bars 178 that connect to the first contact ends 140 of the shield strips 126. These tie bars 175-178 are cut during subsequent manufacturing processes.

The first insulative housing portion 160 may include attachment features (not shown) and the second housing portion 170 may include attachment features (not shown) that correspond to the attachment features of the first insulative housing portion 160 for attachment thereto. Such attachment features may include protrusions and corresponding receiving openings. Other suitable attachment features may also be utilized.

Figure 8A:
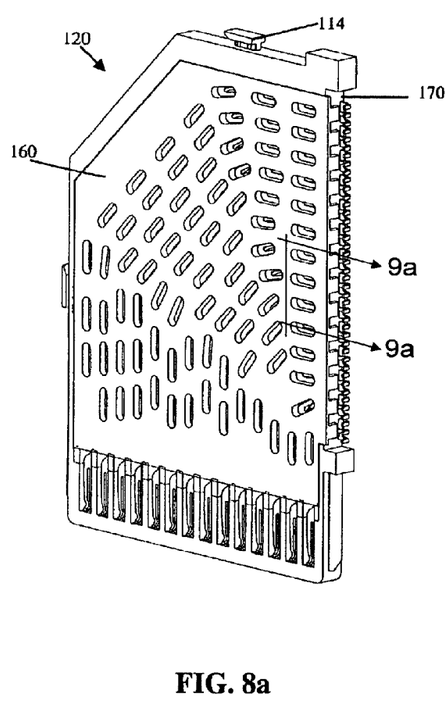
FIG. 8a is a perspective view of an assembled one of the wafers of the first electrical connector of FIG. 2.
Figure 8B:
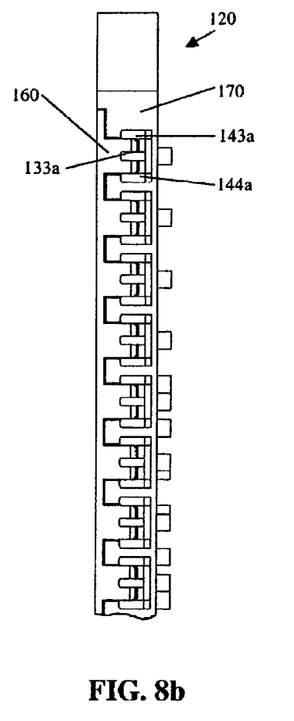
FIG. 8b is a front view of a portion of the assembled wafer of FIG. 8a, showing first contact ends of the signal conductors and the shield strips configured for connection to a printed circuit board.

A first insulative housing portion 160 and the second housing portion 170 may be attached to form a wafer 120. As shown in FIGS. 8a and 8b, each signal conductor 124 is positioned along the surface 141s adjacent a corresponding shield strip 126. The bent edge 147a of the surface 141s is directed toward the corresponding signal conductor 124. The bent edge 147a, in combination with surface 147s, creates shielding on two sides of the adjacent signal conductor 124.

The first electrical connector 100 may also be configured to carry differential pairs of signals. In this configuration, the signal conductors may be organized in pairs. The surface 141s of each shield strip is preferably wider than the width of a pair to provide sufficient shielding to the pair.

Figure 9A:
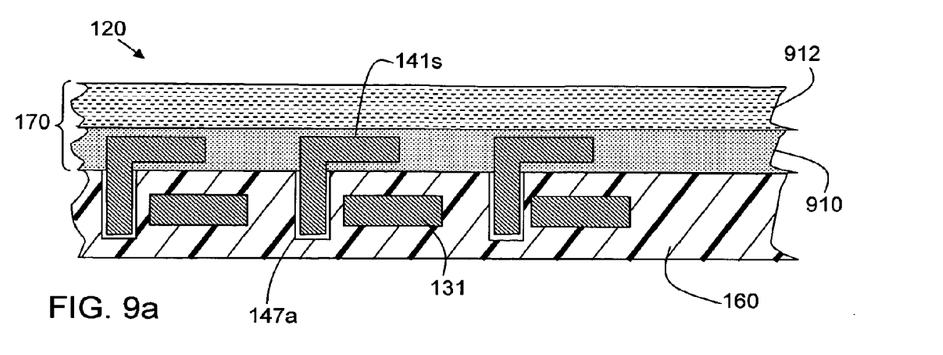

FIG. 9a shows a wafer 120 in cross section taken along the line 9a-9a in FIG. 8a. Intermediate portions 131 of signal conductors 124 are embedded within an insulative housing 160. A portion of shield strips 126 are held within housing portion 170. The shield strips 126 are held with first edge portions 147a projecting between adjacent intermediate portions 131. The surface 141s of each shield strip is held within housing portion 170. Housing portion 170 may be molded around shield strips 126 and first insulative housing 160 may be molded around signal conductors 124 prior to assembly of wafer 120.

In the illustrated embodiment, housing portion 170 is made of two types of materials. Housing portion 170 is shown to contain a layer 910 and a layer 912. Both layers 910 and 912 may be made of a thermoplastic or other suitable binder material such that they may be molded around shield strips 126 to form the housing 170. Either or both of layers 910 and 912 may contain particles to provide layers 910 and 912 with desirable electromagnetic properties.

In the example of FIG. 9a, the thermoplastic material serving as the binder for layer 910 is filled with conducting particles. The fillers make layer 910 "electrically lossy."

Materials that conduct, but with some loss, over the frequency range of interest are referred to herein generally as "electrically lossy" materials. Electrically lossy materials can be formed from lossy dielectric and/or lossy conductive materials. The frequency range of interest depends on the operating parameters of the system in which such a connector is used, but will generally be between about 1 GHz and 25 GHz, though higher frequencies or lower frequencies may be of interest in some applications. Some connector designs may have frequency ranges of interest that span only a portion of this range, such as 1 to 10 GHz or 3 to 15 GHz.

Electrically lossy material can be formed from material traditionally regarded as dielectric materials, such as those that have an electric loss tangent greater than approximately 0.01 in the frequency-range of interest. The "electric loss tangent" is the ratio of the imaginary part to the real part of the complex electrical permittivity of the material. Examples of materials that may be used are those that have an electric loss tangent between approximately 0.04 and 0.2 over a frequency range of interest.

Electrically lossy materials can also be formed from materials that are generally thought of as conductors, but are either relatively poor conductors over the frequency range of interest, contain particles or regions that are sufficiently dispersed that they do not provide high conductivity or otherwise are prepared with properties that lead to a relatively weak bulk conductivity over the frequency range of interest.

Electrically lossy materials may be partially conductive materials, such as those that have a surface resistivity between 1Ω/square and $10^6$Ω/square. In some embodiments, the electrically lossy material has a surface resistivity between 1Ω/square and $10^3$Ω/square. In some embodiments, the electrically lossy material has a surface resistivity between 10Ω/square and 100Ω/square. As a specific example, the material may have a surface resistivity of between about 20Ω/square and 40Ω/square.

In some embodiments, electrically lossy material is formed by adding a filler that contains conductive particles to a binder. Examples of conductive particles that may be used as a filler to form an electrically lossy materials include carbon or graphite formed as fibers, flakes or other particles. Metal in the form of powder, flakes, fibers or other particles may also be used to provide suitable electrically lossy properties. Alternatively, combinations of fillers may be used. For example, metal plated carbon particles may be used. Silver and nickel are suitable metal plating for fibers. Coated particles may be used alone or in combination with other fillers, such as carbon flake.

The binder or matrix may be any material that will set, cure or can otherwise be used to position the filler material. In some embodiments, the binder may be a thermoplastic material such as is traditionally used in the manufacture of electrical connecters to facilitate the molding of the electrically lossy material into the desired shapes and locations as part of the manufacture of the electrical connector. However, many alternative forms of binder materials may be used. Curable materials, such as epoxies, can serve as a binder. Alternatively, materials such as thermosetting resins or adhesives may be used. Also, while the above described binder material are used to create an electrically lossy material by forming a binder around conducting particle fillers, the invention is not so limited. For example, conducting particles may be impregnated into a formed matrix material. As used herein, the term "binder" encompasses a material that encapsulates the filler or is impregnated with the filler.

Preferably, the fillers will be present in a sufficient volume percentage to allow conducting paths to be created from particle to particle. For example, when metal fiber is used, the fiber may be present in about 3% to 40% by volume. The amount of filler may impact the conducting properties of the material.

In one contemplated embodiment, layer 910 has a thickness between 1 and 40 mils (about 0.025 mm to 1 mm). The bulk resistivity of layer 910 depends on its thickness as well as its surface resistivity. The bulk resistivity is suitable to allow the layer to provide some conduction, but with some loss. Bulk resistivity of an electrically lossy structure used herein may be between about 0.010 Ω-cm and 1 Ω-cm. In some embodiments, the bulk resistivity is between about 0.05 Ω-cm and 0.5 Ω-cm. In some embodiments, the bulk resistivity is between about 0.1 Ω-cm and 0.2 Ω-cm.

Layer 912 provides a magnetically lossy layer. Layer 912 may, like layer 910, be formed of a binder or matrix material with fillers. In the pictured embodiment, layer 912 is made by molding a filled binder material. The binder for layer 912 may be the same as the binder used for layer 910 or any other suitable binder. Layer 912 is filled with particles that provide that layer with magnetically lossy characteristics. The magnetically lossy particles may be in any convenient form, such as flakes or fibers. Ferrites are common magnetically lossy materials. Materials such as magnesium ferrite, nickel ferrite, lithium ferrite, yttrium garnet or aluminum garnet may be used.

The "magnetic loss tangent" is the ratio of the imaginary part to the real part of the complex magnetic permeability of the material. Materials with higher loss tangents may also be used. Ferrites will generally have a loss tangent above 0.1 at the frequency range of interest. Presently preferred ferrite materials have a loss tangent between approximately 0.1 and 1.0 over the frequency range of 1 Ghz to 3 GHz and more preferably a magnetic loss tangent above 0.5.

It is possible that a material may simultaneously be a lossy dielectric or a lossy conductor and a magnetically lossy material. Such materials can be formed, for example, by using magnetically lossy fillers that are partially conductive or by using a combination of magnetically lossy and electrically lossy fillers.

Layer 912 plays the role of absorptive material as described in my prior U.S. Pat. No. 6,786,771, which is incorporated herein by reference. Layer 912 reduces resonance between shields in adjacent wafers 120.

Layer 910 provides "bridging" between the individual shield strips 126 within the wafer 120. The bridging provides an electrically lossy path between conducting members over the frequency range of interest. The bridging may be provided by a physical connection to the conducting members that are bridged. In addition, over the frequency range of interest, signals may couple between structures capacitively or otherwise without direct physical contact between the structures. Accordingly, "bridging" may not require direct physical contact between structures.

With bridging in place, each of the shield strips 126 is less likely to resonate independently from the others. Preferably, layer 910 is sufficiently conductive that the individual shield strips do not resonate independently but sufficiently lossy that the shield strips and the bridging do not form a combined structure that, in combination with similar structures in another wafer, support resonant modes between adjacent wafers.

Figure 9B:
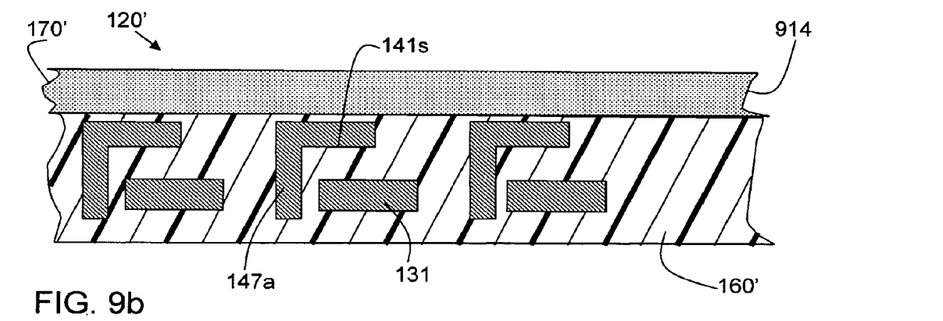

FIG. 9b shows an alternative embodiment of the wafer 120. In wafer 120', intermediate portions 131 of signal conductors 124 and shield strips 126 are held within an insulative housing 160'. Insulative housing 160' may be formed in any convenient manner. It may be formed in a single molding step or in multiple molding steps. Layer 914 is formed on top of insulative housing 160'. Layer 914 is an electrically lossy layer similar to layer 910.

In contrast to layer 910, surfaces 141s of shield strips 126 are not embedded in layer 914. In the embodiment shown, surfaces 141s are not in direct contact with layer 914. The surfaces 141s are separated from layer 914 by a small portion of insulative housing 160'. Each of the surfaces 141s is capacitively coupled to layer 914. In this way, layer 914 provides a partially conductive path at the frequencies of interest bridging the Individual shield strips 126 in wafer 120'. Similar to the configuration in FIG. 9a, partially conductive layer 914 reduces resonances between the shield strips 126 within wafer 120'.

Wafer 120' may optionally be formed with a magnetically lossy material, such as a layer 912 shown in FIG. 9a.

Figure 9C:
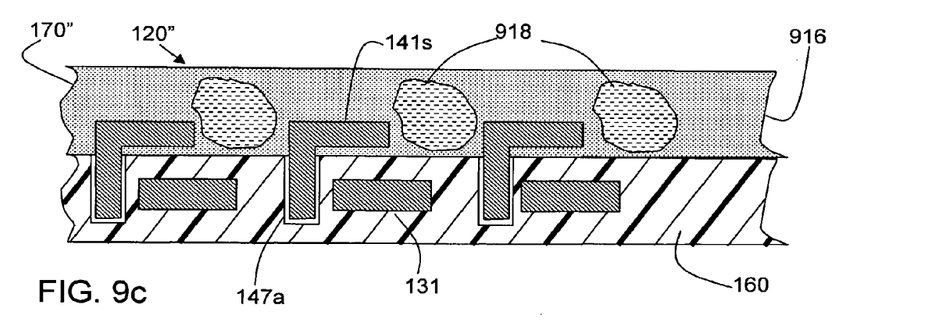

FIG. 9c shows a further embodiment. Wafer 120" includes an insulative housing 160 as shown in FIG. 9a. Surfaces 141s of the shield strips 126 are held within a partially conductive layer 916. Layer 916 may be a partially conductive layer formed in the same fashion as layer 910, thereby bridging the shield strips 126. Regions 918 within layer 916 are formed from magnetically lossy material. Regions 918 may be formed of the same material as is used to form layer 912. Regions 918 may be formed in a separate step or may be formed by adding magnetically lossy particles during the formation of layer 916.

FIGS. 9a and 9c show the use of electrically lossy and magnetically lossy materials in combination. In the described embodiments, both the magnetically lossy and electrically lossy materials are formed by the addition of particles to a binder. It is not necessary that the particles be added to binders forming distinct structures. For example, magnetically lossy and conductive particles may be intermixed in a single layer, such as layer 914, shown in FIG. 9b.

Figure 10A:
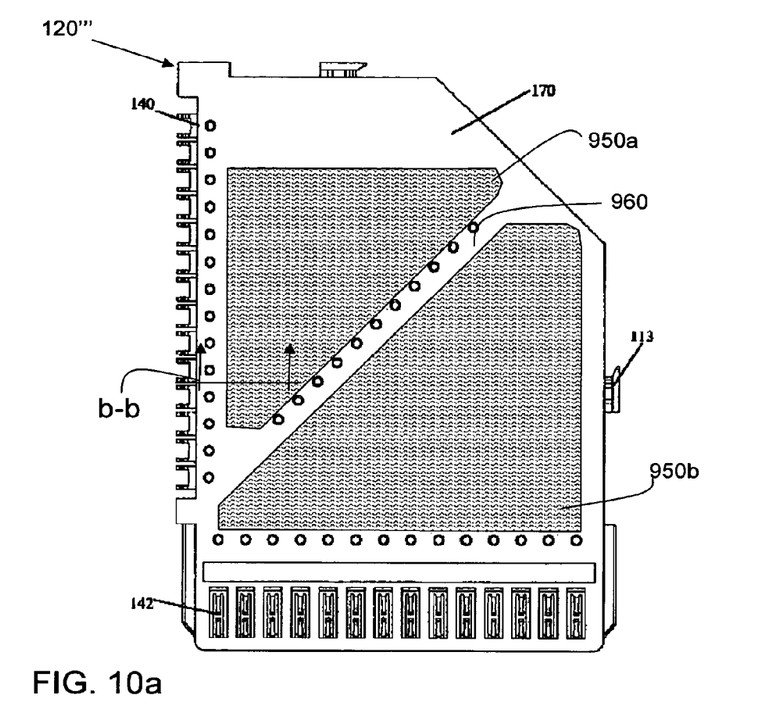
FIG. 10a is a plan view of a wafer formed according to an alternative construction method.

It is also not necessary that bridging between shield strips in a wafer be formed from particles encapsulated in the binder. FIG. 10a shows an alternative construction of a wafer 120'''. Wafer 120''' has inserts 950a and 930b inserted in openings in a surface of wafer 120'''. Preferably, the openings are sufficiently deep that they expose surfaces 141s of the shield strips within the wafer.

Figure 10B:
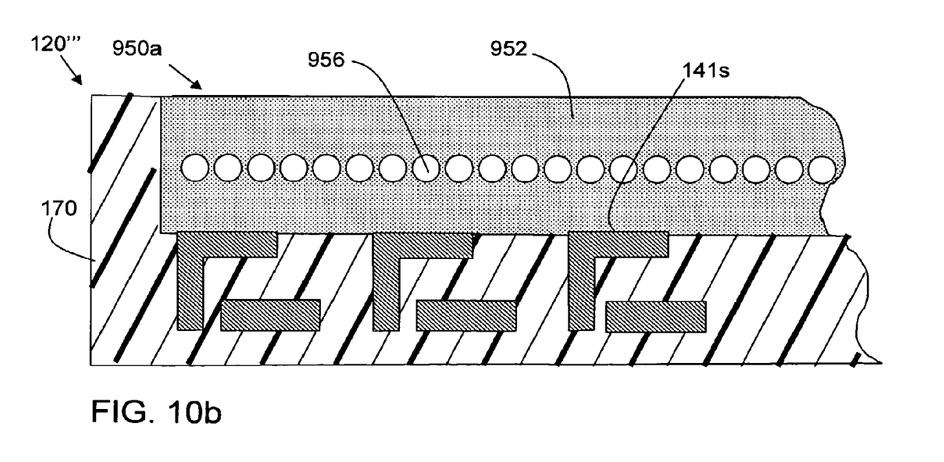
FIG. 10b is a cross sectional view of a portion of the wafer of FIG. 10a taken along the line b-b.

FIG. 10b shows a cross section of a portion of wafer 120''' taken along the line b-b in FIG. 10a. In FIG. 10b, insert 950a is seen in cross-section. Insert 950*a* may, for example, be a lossy conductive carbon filled adhesive preform such as those sold by Techfilm of Billerica, Mass., U.S.A. This preform includes an epoxy binder 952 filled with carbon flakes. The binder surrounds carbon fiber 956, which acts as a reinforcement for the preform. When inserted in a wafer 120''', preform 950*a* adheres to shield strips 126. In this embodiment, preform 950*a* adheres through the adhesive in the preform, which is cured in a heat treating process. Preform 950*a* thereby provides electrically lossy bridging between the shield strips. Various forms of reinforcing fiber, in woven or non-woven form, may be used. Non-woven carbon fiber is one suitable material.

In alternative embodiments, the preforms could be made to include both conductive and magnetically lossy filler. The conductive and magnetically lossy filler may be intermixed in a continuous binder structure or may be deposited in layers.

Figure 11:
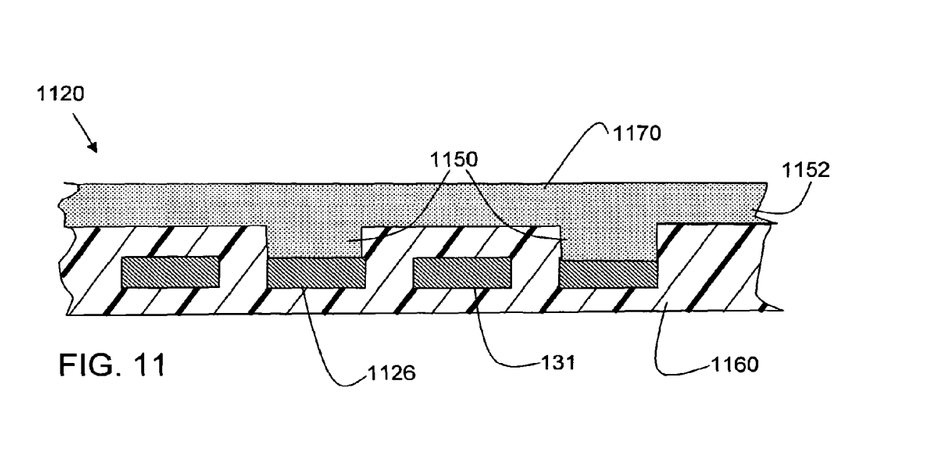
FIG. 11 is a cross sectional view of a wafer according to an alternative embodiment.

Electrically lossy materials may also be used in connectors that do not have ground strips. FIG. 11 shows in cross-section an example of a wafer 1120 that includes signal conductors with intermediate portions 131 embedded in the insulative housing 1160. Wafer 1120 is designed for applications in which alternating signal conductors are connected to ground forming what it is sometimes referred to as a "checkerboard pattern." For example, signal conductor 1126 is intended to be connected to ground. In wafer 1120, a partially conductive layer 1170 is used to provide bridging between signal conductors 1126 that are grounded. Layer 1170 may be formed generally in the same fashion as layers 910 or 914.

Figure 12:
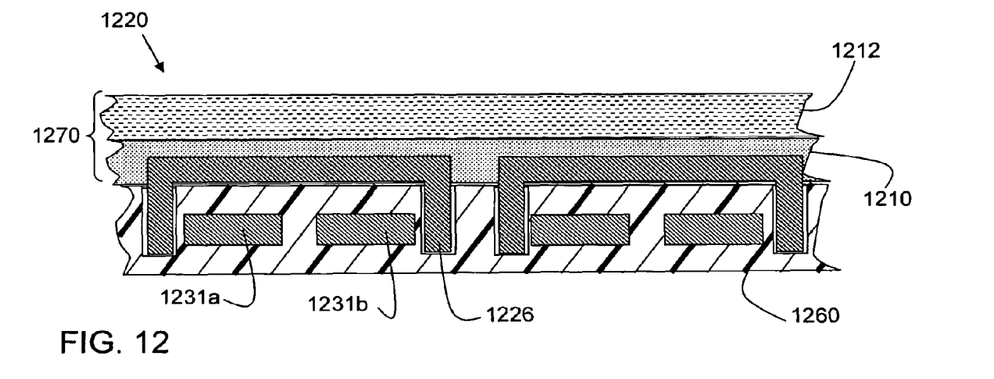
FIG. 12 is a cross section of a wafer formed according to a further alternative embodiment.

FIG. 12 shows a wafer 1220 designed for carrying differential signals. Wafer 1212 includes an insulative housing 1260. Signal conductors such as 1231*a* and 1231*b* are arranged in pairs within insulative housing 1260. Shield members 1226 separate the pairs. Shield strips 1226 are embedded in a housing 1270. In wafer 1220, housing 1270 includes a partially conductive layer 1210 and a magnetically lossy layer 1212. Layers 1012 and 1210 may be formed generally as layers 910 and 912 described above in connection with FIG. 9*a*.

Figure 13:
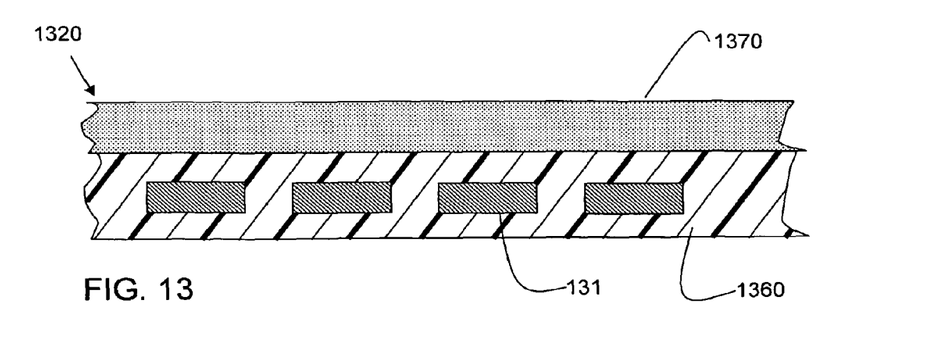
FIG. 13 is a cross section of a wafer formed according to a further alternative embodiment.

FIG. 13 shows a further embodiment of a wafer 1320 that may be used to form an electrical connector as pictured in FIG. 1. Wafer 1320 may be similar to wafer 1120. It contains a plurality of conductors 131 held in an insulative housing 1360. However, none of the signal conductors 131 in wafer 1320 is specifically designed to be connected to ground.

Layer 1370 is an electrically lossy material. It bridges all of the signal conductors 131. Where the benefit of reducing resonances between the signal conductors acting as grounds outweighs any loss of signal integrity caused by attenuation of the signals carried on conductors, layer 1370 provides a net positive impact on the signal integrity of a connector formed with wafers 1370.

In embodiments such as those shown in FIGS. 9*b* and 13 in which the bridging material is not in direct contact with structures serving as ground contacts, there may be no direct electrical connection between the electrically lossy material and ground. Such a connection is not required, though may be included in some applications.

Having thus described several aspects of at least one embodiment of this invention, it is to be appreciated various alterations, modifications, and improvements will readily occur to those skilled in the art.

As one example, it is described that bridging may be provided by capacitively coupling an electrically lossy member to two structures. Because no direct conducting path need be provided, it is possible that the electrically lossy material may be discontinuous, with electrically insulating material between segments of electrically lossy material.

Alternatively, electrically lossy bridging may be formed by creating signal paths that include conductive and lossy materials. For example, FIG. 11 shows a lossy layer 1170 that has vertical portions 1150 adjacent conductors 1126 and a horizontal portion 1152 joining the vertical portions. Portions 1150 and 1152 in combination create an electrically lossy path between contacts 1126. On or the other of these portions may be formed from a conductive material, such as metal. For example, portions 1150 may be electrically lossy material molded into housing 1160 and portion 1152 may be implemented as a metal plate. Though portion 1152 would be conductive, the signal path between adjacent contacts 1126 would be electrically lossy.

Further, example embodiments show each of the signal conductors and ground conductors molded in an insulative housing, such as plastic. However, air is often a suitable dielectric and may be preferable to plastic in some applications. In some embodiments, the conductors within the wafer will be held in an insulative plastic housing over a relatively small portion of their length and surrounded by air, or other dielectric material, over the remainder of their length.

As another example, electrically lossy structures and magnetically lossy structures were described as being formed by embedding particles in a settable binder. Where molding is used, preferably features are provided in each region formed by a separate molding step to interlock the regions.

Partially conductive structures may be formed in any convenient manner. For example, adhesive substances which are inherently partially conductive may be applied to shield strips through windows in an insulative housing. As another alternative, conducting filaments such as carbon fibers may be overlaid on shield members before they are molded into a housing or they may be attached to the shield members with adhesive after the shield members are in place.

Further, lossy conductive material is shown in planar layers. Such a structure is not required. For example, partially conductive regions may be positioned only between shield strips or only between selective shield strips such as those found to be most susceptible to resonances.

Also, it was described that wafers 120 are formed by attaching a subassembly containing signal contacts to a subassembly containing shield members. It is not necessary that the sub-assemblies be secured to each other. However, where desired, the sub-assemblies may be secured with various features including snap fit features or features that engage through function.

Further, electrically and magnetically lossy materials are shown only in connection with a daughter card connector. However, benefits of using such materials is not limited to use in daughter card connectors. Such materials may be used in backplane connectors or in other types of connectors, such as cable connectors, stacking connectors, mezzanine connectors. The concepts may also be applied in connectors other than board to board connectors. Similar concepts may be applied in chip sockets in other types of connectors.

Such alterations, modifications, and improvements are intended to be part of this disclosure, and are intended to be within the spirit and scope of the invention. Accordingly, the foregoing description and drawings are by way of example only.

What is claimed is:

1. An electrical connector comprising:
   a first layer having a first planar surface, the first layer formed from an insulative material;

a plurality of conductors, each of the conductors having an intermediate portion disposed in the first layer; and a second layer having a length, a width, and a second surface, the second layer formed from an electrically lossy material and configured to provide electrical bridging between the plurality of conductors, wherein the second surface of the second layer forms a continuous planar surface extending along an entirety of the length and an entirety of the width of the second layer, the continuous planar surface being parallel to and in direct contact with the first planar surface.

2. The electrical connector of claim 1, wherein there is no physical contact between the plurality of conductors and the second layer, and the bridging between the plurality of conductors occurs capacitively between each of the plurality of conductors and the second layer.

3. The electrical connector of claim 1, wherein the intermediate portion of each of the plurality of conductors further comprises:
    an edge; and
    a planar surface extending substantially perpendicular from the edge to facilitate the electrical bridging between the plurality of conductors.

4. The electrical connector of claim 3, wherein there is no physical contact between the plurality of conductors and the second layer, and the electrical bridging between the plurality of conductors occurs capacitively between each of the plurality of conductors and the second layer.

5. The electrical connector of claim 1 further comprising a third layer adjacent the second layer and opposite the first layer, wherein the third layer is formed from a magnetically lossy material, and wherein the third layer is configured to reduce entry of unwanted signals into the plurality of conductors.

6. The electrical connector of claim 1, wherein the second layer is also formed from a magnetically lossy material, and the magnetic lossy material is configured to reduce entry of unwanted signals into the plurality of conductors.

7. The electrical connector of claim 1, wherein the second layer is further formed from carbon fiber that reinforces the second layer.

8. The electrical connector of claim 1, wherein the plurality of conductors are substantially parallel.

9. The electrical connector of claim 1, wherein the intermediate portions of the plurality of conductors are substantially parallel to each other.

10. The electrical connector of claim 1, wherein the electrically lossy material is electrically conductive over a predetermined frequency range.

11. The electrical connector of claim 1, wherein the second layer does not extend into the first layer.

12. The electrical connector of claim 1, wherein the second layer is disconnected from ground.

13. The electrical connector of claim 1, wherein the second layer is not grounded.

14. An electrical connector comprising:
    a first layer having a first planar surface, the first layer formed from an insulative material;
    a plurality of conductors, one of the conductors being electrically connected to ground, each of the conductors having an intermediate portion disposed in the first layer; and
    a second layer having a length, a width, and a second surface, the second layer formed from an electrically lossy material and configured to provide electrical bridging between the plurality of conductors,
    wherein the second surface of the second layer forms a continuous planar surface extending along the entirety of the length and the width of the second layer which is parallel to and in direct contact with the first planar surface.

15. The electrical connector of claim 14, wherein there is no physical contact between the plurality of conductors and the second layer, and the bridging between the plurality of conductors occurs capacitively between each of the plurality of conductors and the second layer.

16. The electrical connector of claim 14, wherein the intermediate portion of each of the plurality of conductors further comprises:
    an edge; and
    a planar surface extending substantially perpendicular from the edge to facilitate the electrical bridging between the plurality of conductors.

17. The electrical connector of claim 16, wherein there is no physical contact between the plurality of conductors and the second layer, and the electrical bridging between the plurality of conductors occurs capacitively between each of the plurality of conductors and the second layer.

18. The electrical connector of claim 14, Further comprising a third layer adjacent the second layer and opposite the first layer, wherein the third layer is formed from a magnetically lossy material, and wherein the third layer is configured to reduce entry of unwanted signals into the plurality of conductors.

19. The electrical connector of claim 14, wherein the second layer is also formed from a magnetically lossy material, and the magnetic lossy material is configured to reduce entry of unwanted signals into the plurality of conductors.

20. The electrical connector of claim 14, wherein the second layer is further formed from carbon fiber that reinforces the second layer.

21. The electrical connector of claim 14, wherein the plurality of conductors are substantially parallel.

22. The electrical connector of claim 14, wherein the intermediate portions of the plurality of conductors are substantially parallel to each other.

23. The electrical connector of claim 14, wherein the electrically lossy material is electrically conductive over a predetermined frequency range.

24. An electrical connector comprising:
    a first layer having a first planar surface and a second surface opposite the first planar surface, the first layer formed from an insulative material;
    a plurality of conductors, each of the conductors having an intermediate portion disposed in the first layer; and
    a second layer having a length, a width a first surface and a second surface opposite the first surface, the second layer formed from an electrically lossy material and configured to provide electrical bridging between the plurality of conductors,
    wherein the second surface of the second layer forms a continuous planar surface extending along the entirely of the length and the width of the second layer which is parallel to and in direct contact with the first planar surface.

25. The electrical connector of claim 24, wherein no portion of the second layer extends into the first layer.

* * * * *